United States Patent [19]
Dillinger

[11] Patent Number: 5,929,660
[45] Date of Patent: Jul. 27, 1999

[54] DYNAMIC, SINGLE-ENDED SENSE AMPLIFIER

[75] Inventor: Stephen C. Dillinger, Woodland Park, Colo.

[73] Assignee: United Technologies Corporation, Hartford, Conn.

[21] Appl. No.: 08/999,426

[22] Filed: Dec. 29, 1997

[51] Int. Cl.$^6$ ........................................ G11C 7/06
[52] U.S. Cl. ............................... 327/57; 327/51
[58] Field of Search ................... 327/51–57; 365/189.05

[56] References Cited

U.S. PATENT DOCUMENTS

| | | | |
|---|---|---|---|
| 5,384,504 | 1/1995 | Dickinson et al. | 327/51 |
| 5,410,268 | 4/1995 | Sharpe-Geisler | 327/51 |
| 5,416,371 | 5/1995 | Katayama et al. | 327/57 |
| 5,426,385 | 6/1995 | Lai | 327/57 |
| 5,526,314 | 6/1996 | Kumar | 327/57 |
| 5,544,110 | 8/1996 | Yuh | 327/57 |
| 5,576,644 | 11/1996 | Pelella | 327/51 |
| 5,610,540 | 3/1997 | Althoff et al. | 327/51 |
| 5,619,149 | 4/1997 | Lev et al. | 327/51 |
| 5,646,892 | 7/1997 | Masuda et al. | 365/189.05 |
| 5,751,649 | 5/1998 | Kornachuk et al. | 365/189.05 |
| 5,844,428 | 12/1998 | Jiang | 327/57 |

*Primary Examiner*—Toan Tran
*Attorney, Agent, or Firm*—Richard H. Kosakowski; Holland & Bonzagni, P.C.

[57] ABSTRACT

A single-ended sense amplifier pre-charges the data output line of a bank of memory cells or register file to approximately the switch point of an inverter that is part of a buffer, in preparation for the next data read cycle. The amplifier includes a stack of six transistors connected in series between a supply voltage and ground. The memory output is connected to the stack mid-point, to a latch input and to a buffer input. The most recent binary logic level read from memory passes through the latch. The latch and stack are then clocked, and the three-transistor portion of the stack turned on pulls the voltage on the stack mid-point to approximately one-half the supply voltage, which is the buffer inverter switch point. The stack is then turned off, and the stack mid-point floats at that voltage value in preparation for the next read cycle. As such, the common data line needs only slew a relatively small amount of voltage during the next read cycle. Also, the circuit of the present invention will "track" over process and temperature variations, thereby making its performance relatively consistent because the actual inverter switch point terminates the pre-charge.

20 Claims, 2 Drawing Sheets

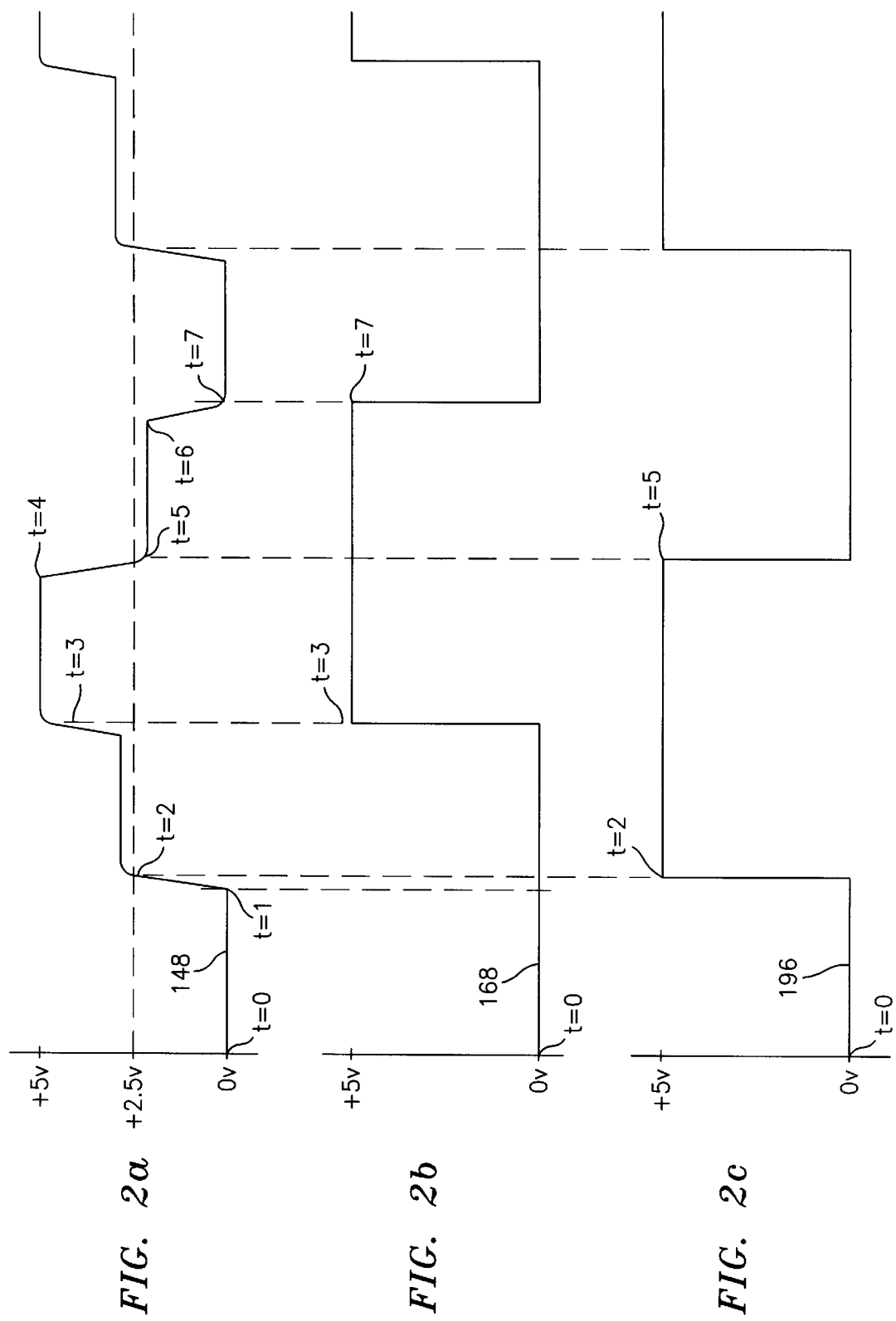

5,929,660

DYNAMIC, SINGLE-ENDED SENSE AMPLIFIER

TECHNICAL FIELD

This invention relates generally to a sense amplifier for a memory device, and more particularly to a single-ended sense amplifier that pre-charges a common data output line from a bank of memory cells or register file to a voltage value of approximately the switch point of an inverter, in preparation for reading data from the memory cells or register file.

BACKGROUND ART

Various types of memory storage devices typically utilize a sense amplifier to amplify the voltage or current level stored in the individual memory cells. This voltage or current level represents the logic state stored in the memory cells. Static random access memory ("SRAM") devices store data in a cell comprising a flip-flop which is typically made up of six transistors. On the other hand, dynamic random access memory ("DRAM") devices store data in a cell comprising a small value capacitor and a transistor.

Regardless of the type or technology of memory, usually the voltage or current level signal stored in a memory cell is a very small value. The sense amplifier must amplify this normally severely attenuated signal. Further, since such signals can be of a level that is much smaller that undesired signals picked up by crosstalk from other parts of the memory device, the sense amplifier generally must be capable of rejecting such noise signals. As a result, prior art sense amplifiers typically have been differential amplifiers having a relatively high common-mode rejection capability. This is because picked-up interference is usually a common-mode signal. However, differential amplifiers are useful only with memories having complementary dual outputs. They are not useful for memories having a single-ended output.

Another consideration with the design of sense amplifiers is that of power dissipation and speed of operation. Fully static RAMs are those in which the sense amplifiers are turned on all the time. The problem with this is that the power dissipation level is relatively high and the speed relatively slow. To reduce the power dissipation level and increase the speed, some SRAMs use sense amplifiers that are normally turned off and activated only when needed to carry out the sensing function.

DISCLOSURE OF INVENTION

Objects of the invention include the provision of a single-ended sense amplifier that pre-charges the common data output line of a bank of memory cells or register file to a value of approximately the switch point of an inverter in preparation for the next reading of data from the memory cells or register file, thereby significantly reducing the required amount of voltage swing on the data output line when the data value is next read from the cells or register file, thus, significantly reducing the time required for the data output value, read from the cells or register file, to assume its logic state output value at the output of the sense amplifier.

According to the invention, a dynamic, single-ended sense amplifier comprises a vertical stack of six MOS transistors that function as switches connected in series between a positive supply voltage, Vdd (e.g., +5 V), and Vss (e.g., ground or 0 v). A top group of three PMOS transistors in the stack are connected in series between Vdd and the mid-point of the stack. A bottom group of three NMOS transistors in the stack are connected between the stack mid-point and Vss. The common single output data line from a bank or plurality of memory cells or register file is also connected to the mid-point of the stack. The mid-point of the stack represents a pre-charge node whose voltage value is pre-charged or pre-set to approximately the switch point of an inverter comprising part of a pre-charge gain buffer, wherein the inverter switch point is set at approximately one-half of Vdd. This pre-charging is done in preparation for the next read data cycle. The stack of six transistors comprises a pre-charge driver.

The pre-charge node connects to the input of a D-type latch and to the input of the pre-charge gain buffer. The latch stores either one of two different binary logic states. Essentially, the latch stores the most recent logic state on the common single data line from the memory cells or register file. The buffer comprises two pairs of complementary MOS transistors arranged as inverters. The output of the first inverter is connected to the input of the second inverter. The first and second inverters are connected back-to-back. The output of the second inverter represents the output of the buffer and is connected both to the gate of an NMOS transistor in the bottom group of the stack and to the gate of a PMOS transistor in the top group of the stack. The output of the latch represents the output of the sense amplifier.

The latch output is connected both to the gate of a PMOS transistor in the top group of the stack and to the gate of an NMOS transistor in the bottom group of the stack. A first square wave clock signal is connected to the gate of a PMOS transistor in the top group of the stack, while a second square wave clock signal, having a phase opposite the phase of the first square wave clock signal, is connected to the gate of an NMOS transistor in the bottom group of the stack.

In operation, the most recent binary logic level on the common data line read from the memory cells or register file is passed through the latch when the latch is not clocked and acting transparently. The same logic level is also at the output of the pre-charge buffer. If the binary logic level on the pre-charge node is logic low, two of the PMOS top stack transistors are turned on. In contrast, if the binary logic level on the pre-charge node is logic high, two of the NMOS bottom stack transistors are turned on. Thus, never are both transistor stacks turned on at the same time.

Once the latch is clocked, the latch input is fixed at the latch output. The same clock that clocks the latch also clocks one of the transistors in each stack. Once the stack that has two of its transistors turned on by the latch output and buffer output has its third transistor turned on by the clock, that stack starts pulling the voltage level on the pre-charge node toward Vdd. As the voltage level on the pre-charge node reaches one-half of Vdd, it will continue beyond one-half Vdd, but only for a short period of time. This is because as the voltage on the pre-charge node crossed the switch point (e.g., one-half of Vdd) of the two inverters comprising the pre-charge buffer, the pre-charge buffer will switch the logic state at its output, which turns off one of the transistors in the previously turned-on stack, thereby turning off the entire stack. With no stack turned completely on, the voltage at the pre-charge node will "float" at approximately one-half Vdd (within approximately 100 mV of one-half Vdd, or near the buffer inverter switch point) in preparation for the next read cycle. As such, the common data line needs only slew a relatively small amount of voltage during the next read cycle. This reduced voltage swing allows the output of the bank of memory cells or register file to be read relatively much quicker. Also, the circuit of the present invention will "track" over process and temperature variations, thereby making its performance relatively consistent because the actual inverter switch point terminates the pre-charge.

The above and other objects and advantages of this invention will become more readily apparent when the following description is read in conjunction with the accompanying drawings.

BRIEF DESCRIPTION OF DRAWINGS

FIG. 2, including FIGS. 2a–2c, are timing diagrams of voltages at various nodes within the pre-charge circuit of FIG. 1.

BEST MODE FOR CARRYING OUT THE INVENTION

Figure 1:
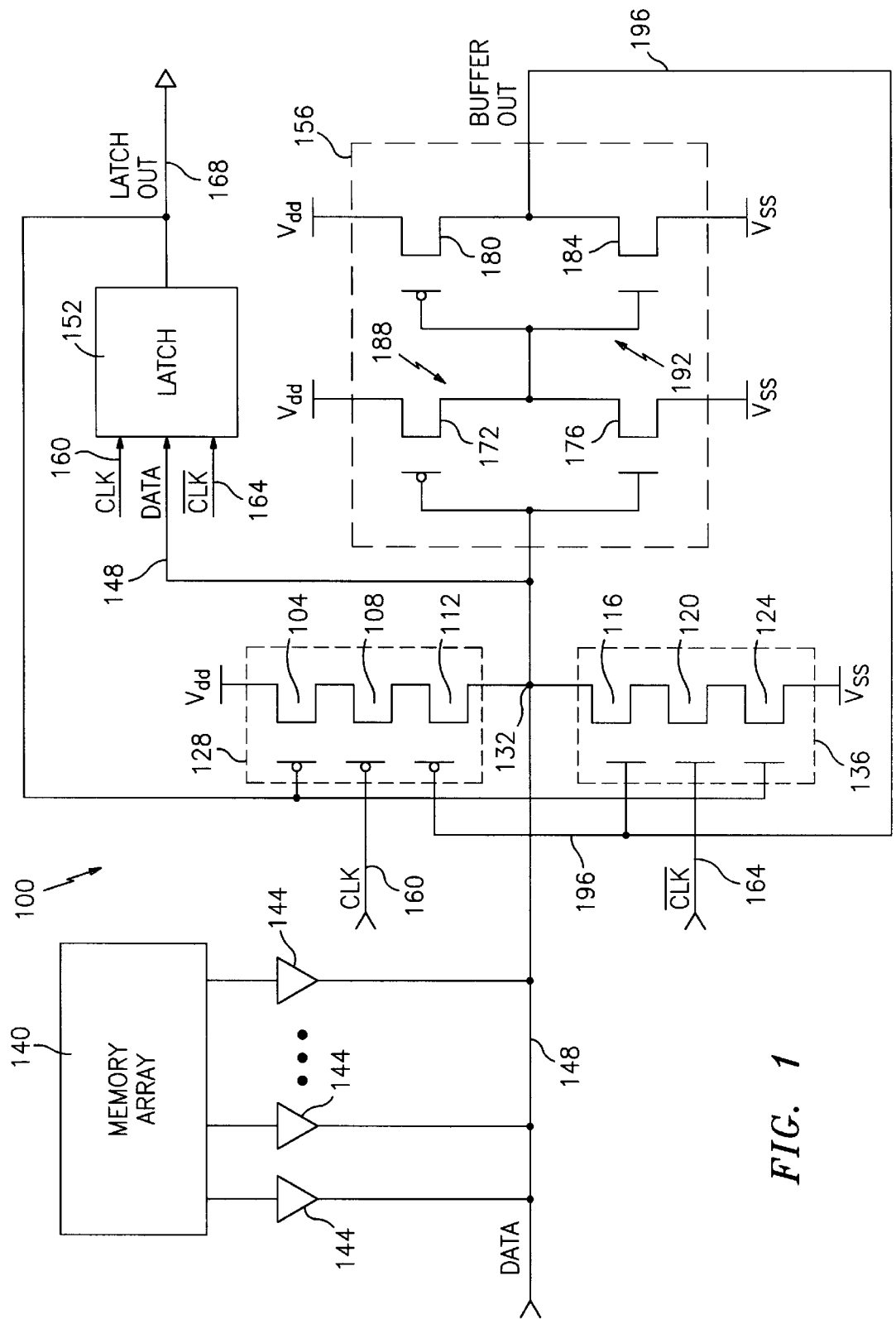
FIG. 1 is an electrical schematic diagram of the pre-charge circuit of the present invention connected with a bank of memory cells or register file.

Referring to FIG. 1, a dynamic, single-ended sense amplifier 100, according to a preferred exemplary embodiment of the present invention, comprises a vertical stack of six MOS transistors 104–124 that function as switches connected in series between a positive supply voltage, Vdd (e.g., +5 V), and Vss (e.g., ground or 0 v). A top group 128 of three PMOS transistors 104–112 in the stack are connected in series between Vdd and the mid-point or node 132 of the stack. When all three transistors 104–112 in the top group 128 are turned on, they pull the mid-point 132 of the stack toward Vdd. A bottom group 136 of three NMOS transistors 116–124 in the stack are connected between the stack mid-point 132 and Vss. When all three transistors 116–124 in the bottom group 136 are turned on, they pull the stack mid-point 132 toward Vss. As discussed in detail hereinafter with respect to the operation of the preferred exemplary embodiment of the sense amplifier 100 of the present invention, never are both transistor groups 128,136 turned on at the same time. However, during certain time periods of amplifier 100 operation, both transistor groups 128,136 are turned off at the same time. As such, the mid-point 132 of the stack will then "float" at approximately one-half of the absolute value of the voltage difference between Vdd and Vss, or at +2.5 V.

The sense amplifier 100 of the present invention is utilized with a bank or plurality of memory cells arranged in a memory array or a register file 140. Typically, a sense amplifier 100, like that of the present invention, is required to amplify or increase the voltage of the output signal(s) from the memory array 140 to a level suitable for use by subsequent circuitry (not shown) within, e.g., a microprocessor-based system. The memory cells in the array 140 may comprise, e.g, an SRAM or other type of storage device. Typically, these devices store data in either one of two binary logic states. Output from the memory array 140 are a plurality of individual data lines, each connected to an amplifier/inverter 144. Once output from the inverters 144, the individual data lines are connected together as one common data output signal line 148, labeled DATA in FIG. 1. The memory array 140 thus described is of the type referred to as a single-ended output, as opposed to other known types of memory arrays having a pair of differential outputs.

The common single output data line 148 from the memory array or register file 140 is connected to the stack mid-point 132. The mid-point 132 of the stack represents a pre-charge node whose voltage value is pre-charged or pre-set by the sense amplifier 100 of the present invention to approximately one-half of the value of Vdd, in preparation for the next read data cycle, as described in detail hereinafter. The stack of six transistors 104–124 thus comprises a pre-charge driver for "pulling" or "driving" the voltage value of the data line 148 to a predetermined value.

The pre-charge node 132 connects to the input of a D-type latch 152 and to the input of a pre-charge gain buffer 156. When appropriately clocked by either one of two clock signals, CLK 160 or CLK/ 164, the latch 152 latches or stores either one of the two different binary logic states (i.e., logic "0" or low, logic "1" or high) presented at the latch input on the DATA signal line 148. When clocked, the latch 152 stores the most recent logic state on the data line 148 and makes this logic level available on the latch output signal, LATCH OUT, on the signal line 168. In contrast, when the latch 152 is not clocked, the latch is merely passing the logic level at its input to the latch output signal line 168. As such, the latch 152 is acting transparently. If the logic level of the latch input signal 148 is changing during times of transparent latch operation, the corresponding latch output signal 168 also changes such that the latch output equals the latch input. The latch output signal 168 represents the output of the sense amplifier 100.

The buffer 156 comprises two pairs of complementary MOS transistors 172–184 arranged as a pair of inverters 188,192. The output of the first inverter 188 is connected to the input of the second inverter 192. The first and second inverters 188,192 are connected back-to-back. The output of the second inverter 192 is the output of the buffer 156 and is represented by the signal BUFFER OUT on the signal line 196. The buffer output signal 196 is connected both to the gate of an NMOS transistor 116 in the bottom group 136 of the stack and to the gate of a PMOS transistor 112 in the top group 128 of the stack.

The latch output signal 168 is connected both to the gate of a PMOS transistor 104 in the top group 128 of the stack and to the gate of an NMOS transistor 124 in the bottom group 136 of the stack. A first square wave clock signal, CLK 160, is connected to the gate of a PMOS transistor 108 in the top group 128 of the stack, while a second square wave clock signal, CLK/ 164, having a phase opposite the phase of the first square wave clock signal 160, is connected to the gate of an NMOS 120 transistor in the bottom group 136 of the stack.

Referring also to FIG. 2, a description of the operation of the exemplary embodiment of the sense amplifier 100 of FIG. 1 follows. FIG. 2 separately comprises FIG. 2a, FIG. 2b and FIG. 2c. FIG. 2a is a timing diagram of voltage (on the vertical axis) versus time (on the horizontal axis) for the DATA signal 148 at the pre-charge node 132. FIG. 2b is a timing diagram of the voltage at the latch output 168, while FIG. 2c is a timing diagram of the voltage at the buffer output 196.

At time t=0 in FIGS. 2a–2c, the voltage level of all three of the signals DATA 148, LATCH OUT 168 and BUFFER OUT 196 is zero volts. That is, a logic low is being read out from the memory array 140 at this time. The choice of a logic low is purely exemplary and is chosen for purposes of explanation. Also starting at time t=0, the latch 152 is not being clocked but, instead, is acting transparently. Thus, the logic low at the latch input 148 is being passed through to the latch output 168 and to the buffer output 196. Since the pre-charge node 132 is logic low, two of the PMOS transistors 104,112 in the top group 128 are turned on, one transistor 104 by the logic low on the LATCH OUT signal 168, another transistor 112 by the logic low on the BUFFER OUT signal 196.

At time t=1 in FIG. 2a, the CLK signal 160 turns on a third PMOS transistor 108 in the top group 132. The CLK signal 160 also clocks the latch 152 such that the logic low at the latch input 148 is latched at the latch output 168 of FIG. 2b. Thus, at time t=1, all three PMOS transistors 104–112 in the top group 128 of the stack are turned on. This switches Vdd (+5 V) onto the pre-charge node 132, which starts charging towards Vdd. However, at time t=2 in FIG. 2a, the voltage on the pre-charge node 132 has reached +2.5 V (or approximately one-half of Vdd), which is the switching threshold for the first inverter 188 within the buffer 156. It should be understood that the choice of a switching threshold or switch point of +2.5 V for the first inverter 188 (which represents approximately one-half of Vdd) is purely exemplary. Other switch points other than the one described herein may be utilized. It suffices that the switch point chosen be such as to shut off either the top group 126 or bottom group 136 of the stack.

At time t=2 in FIG. 2c, the buffer output 196 switches logic states to a logic high. This turns off the corresponding PMOS transistor 112 in the top group 128 of the stack, which essentially turns off the entire top group 128. This causes the pre-charge node 132 to cease climbing towards Vdd. Now, the pre-charge node 132 is essentially "floating" at approximately +2.5 V. In actuality, the voltage on the pre-charge node 132 has overshot the +2.5 V level by approximately 100 mV, as shown in FIG. 2a at time t=2. Thus, starting at time t=2, the voltage on the pre-charge node 132 is approximately 100 mV above +2.5 V, a logic low is latched at the latch output 168 in FIG. 2b, and the buffer output 196 is at a logic high in FIG. 2c. It should be noted that the value of 100 mV for the amount of overshoot is purely exemplary and depends upon various factors, including the type of components used to implement the sense amplifier 100. Nevertheless, the amount of resulting overshoot in either direction should be relatively small.

At time t=3 in FIG. 2b, the latch 152 is no longer clocked. Instead, the latch 152 is acting transparently and is passing the logic level at the latch input 128 to the latch output 168. At time t=3 in FIG. 2a, the voltage on the data line 148 exceeds the switching threshold, which causes the latch output 168 to be at a logic high level. This is reflected in the waveform of FIG. 2b. During the time period immediately prior to time t=3, the voltage level on the pre-charge node 132 starts rising towards Vdd. This is purely exemplary and is chosen to illustrate that, just prior to time t=3, the data being read from the memory array 140 is at a logic high. Instead, a logic low could have been read out from the memory array 140 just prior to time t=3. If this was the case, the voltage waveform 148 of FIG. 2a at the pre-charge node 132 would start transitioning down towards zero volts.

The logic high at the latch output 168 at time t=3 turns on one of the NMOS transistors 124 in the bottom group 136 of the stack. The logic high on the buffer output 196 at time t=3 turns on another NMOS transistor 116 in the bottom group 136. This continues until time t=4 in FIG. 2a, when the CLK/ signal 164 turns on the third NMOS transistor 120 in the bottom group 136 of the stack. At time t=4, all three NMOS transistors 116–124 in the bottom group 136 are turned on, which switches zero volts onto the pre-charge node 132. This causes the pre-charge node 132 to start transitioning towards zero volts, as shown in FIG. 2a. Also, at time t=4, the latch 152 latches a high logic level onto the latch output 168.

At time t=5 in FIG. 2a, the voltage level on the DATA signal 148 on the pre-charge node 132 has crossed slightly below the threshold of +2.5 V for the first inverter 188 of the buffer 156. When this occurs at time t=5, the buffer output signal 196 transitions to a logic low, which turns off the associated NMOS transistor 116 in the bottom group 136 of the stack, essentially shutting off the entire bottom group 136. The voltage level at the pre-charge node 132 now floats at slightly below (e.g., 100 mV) +2.5 V.

Thus, it can be seen from the foregoing two examples that the voltage level on the pre-charge node 132 either overshoots or undershoots the switch point of the first inverter 188 depending upon which direction (i.e., either logic high or logic low) the node 132 is moving away from.

The pre-charge node 132 remains floating at this voltage level until time t=6 in FIG. 2a, when a logic low is now being read out of the memory array 140 on the data line 148. At time t=7 the latch 152 is now transparently passing the logic low at its input 148 to the latch output 168, as seen in FIG. 2b. Thus, subsequent to time t=7, the waveforms of FIGS. 2a–2c are similar to the waveforms at time t=0, described above.

It can be seen from the foregoing that the transistor stack comprising the pre-charge driver comprises means for driving the data line 148 from the memory array 140 very near to the switch point (e.g., +2.5 V or one-half of Vdd) of the first inverter 188 within the buffer 156. This is done in preparation for reading data from the memory array 140.

Essentially, either the top group 128 or the bottom group 136, within the transistor stack, drives the memory array data line 148 toward +2.5 V by using the latched data read from the array 140 during the previous read cycle. As described, either the top group 128 or the bottom group 136 of the transistor stack is enabled, never both groups at once. This has the effect of reducing the "shoot-through" current while pre-charging the node 132.

Once the voltage level on the data line 148 passes through the switch point of the first inverter 188 of the buffer 156, the group of transistors that was on shuts off, causing the pre-charge node to float at approximately +2.5 V. This effectively leaves the memory array data line 148 very near the inverter switch point. As described and illustrated above, the next read cycle then needs to slew the data line 148 only approximately 100 mV to read data in the next read cycle. This relatively small voltage swing allows the memory array data to be read very quickly.

The single-ended sense amplifier 100 of the present invention has utility in that it pre-charges the common data output line 148 of a bank of memory cells or register file 140 to a value of approximately the switch point of the first inverter 188 within the buffer 156, or to a value of approximately one-half of the supply voltage. This is done in preparation for the next reading of data from the memory cells or register file. This significantly reduces the required amount of voltage swing on the data output line 148 when the data value is next read from the cells or register file. In turn, this significantly reduces the time required for the memory data output to assume its output logic state at the output 168 of the sense amplifier 100.

The sense amplifier 100 of the present invention has been described and illustrated as comprising a pre-charge driver made up of six MOS transistors 104–124 connected in series and segregated into two groups 128, 136. However, this is strictly exemplary. Other types of switching devices may be chosen; for example, bipolar transistors or non-transistor devices. Further, more or less than six transistors may be employed. It suffices for the broadest scope of the present invention that the pre-charge driver comprise means for utilizing the previous or most recent logic state read from memory to drive the memory output line away from that logic state to a voltage level that is very near the switch point of the buffer.

Also, the sense amplifier 100 has been described and illustrated as including a pre-charge buffer 156 made up of a pair of inverters. Further, the inverters are described as comprising CMOS transistors. However, this is purely exemplary; other buffer means may be employed that should be apparent to one of ordinary skill in the art in light of the teachings herein. It suffices for the broadest scope of the present invention that the buffer means employed comprise means for stopping the pre-charging of the voltage level on the memory output data line at a predetermined time, thereby stopping the pre-charging of the voltage level on the data line at a predetermined value which is very near the switch point of the buffer inverter.

Further, the sense amplifier 100 of the present invention has been described and illustrated as comprising a D-type latch for storing the previous or most recent logic state from the memory array or register file 140. However, it is to be understood that this is purely exemplary. Other means for storing the most recent memory data may be employed. It suffices for the broadest scope of the present invention that some means for storing memory output data be employed.

It should be understood by those skilled in the art that obvious structural modifications can be made, in light of the teachings herein, without departing from the scope of the invention. Accordingly, reference should be made primarily to the accompanying claims, rather than the foregoing specification, to determine the scope of the invention.

Having thus described the invention, what is claimed is:

1. A sense amplifier connected with a storage output signal from a storage device, the sense amplifier comprising:

driver means, connected to the storage output signal, for providing the storage output signal with a predetermined voltage value during a first predetermined time period, and for allowing a voltage value on the storage output signal to assume a voltage value provided by the storage device during a second predetermined time period, the second predetermined time period being a time period that the assumed voltage value on the storage output signal is being read from the storage device during a read cycle;

buffer means, having an input connected to the storage output signal, for comparing the voltage value of the storage output signal to a threshold value and for providing a feedback signal to the driver means indicative of the result of the comparison; and latch means, connected to the storage output signal, for storing a voltage value on the storage output signal at the start of the first predetermined time period during the first predetermined time period, and for providing a latch output signal indicative of the stored voltage value in the latch means during the first predetermined time period;

wherein the driver means comprises means, responsive to both the feedback signal and the latch output signal, for providing the storage output signal with the predetermined voltage value during the first predetermined time period.

2. The sense amplifier of claim 1, wherein the driver means comprises a first switching means and a second switching means, the first switching means comprising means, when enabled, for switching a voltage of a first value onto the storage output signal during the first predetermined time period, the second switching means comprising means, when enabled, for switching a voltage of a second value onto the storage output signal during the first predetermined time period.

3. The sense amplifer of claim 2, wherein when the first switching means is enabled to switch the first voltage value onto the storage output signal during the first predetermined time period then the voltage value on the storage output signal is changing toward the predetermined voltage value, the buffer means comprises means for providing the feedback signal to the first switching means to disable the first switching means from further switching the first voltage value onto the storage output signal when the voltage value on the storage output signal has reached the predetermined voltage value.

4. The sense amplifer of claim 2, wherein when the second switching means is enabled to switch the second voltage value onto the storage output signal during the first predetermined time period then the voltage value on the storage output signal is changing toward the predetermined voltage value, the buffer means comprises means for providing the feedback signal to the first switching means to disable the second switching means from further switching the second voltage value onto the storage output signal when the voltage value on the storage output signal has reached the predetermined voltage value.

5. The sense amplifier of claim 2, wherein the first switching means is enabled in part to switch the first voltage value onto the storage output signal during the first predetermined time period by a first predetermined voltage value on the latch output signal.

6. The sense amplifier of claim 2, wherein the second switching means is enabled in part to switch the second voltage value onto the storage output signal during the first predetermined time period by a second predetermined voltage value on the latch output signal.

7. The sense amplifier of claim 2, wherein the buffer means comprises first inverter means and second inverter means, an input of the first inverter means comprising the input of the buffer means, an output of the first inverter means being being connected to an input of the second inverter means, an output of the second inverter means comprising the feedback signal.

8. The sense amplifier of claim 7, wherein the first and second inverter means comprise means for providing a logic state at the output of the second inverter means as a result of a comparison of the voltage value of the storage output signal to the threshold value.

9. The sense amplifier of claim 8, wherein the first switching means is enabled in part to switch the first voltage value onto the storage output signal during the first predetermined time period by a first logic state at the output of the second inverter means.

10. The sense amplifier of claim 8, wherein the second switching means is enabled in part to switch the second voltage value onto the storage output signal during the first predetermined time period by a second logic state at the output of the second inverter means.

11. The sense amplifier of claim 2, wherein the first switching means comprises a plurality of switching transistors, each one of the plurality of switching transistors having an output and an input, the output of each one of the plurality of switching transistors being enabled by a certain voltage value at the input of the transistor, the outputs of the plurality of switching transistors being connected in series between the storage output signal and a first voltage supply having the first voltage value, an input of a first one of the plurality of switching transistors being connected to the feedback signal, an input of a second one of the plurality of switching transistors being connected to the latch output signal, an input of a third one of the plurality of switching transistors being connected to a first time-varying clock signal, the first switching means being enabled to switch the first voltage value onto the storage output signal when each one of the plurality of switching transistors are enabled by the corresponding transistor input.

12. The sense amplifier of claim 2, wherein the second switching means comprises a plurality of switching transistors, each one of the plurality of switching transistors having an output and an input, the output of each one of the plurality of switching transistors being enabled by a certain voltage value at the input of the transistor, the outputs of the plurality of switching transistors being connected in series between the storage output signal and a second voltage supply having the second voltage value, an input of a first one of the plurality of switching transistors being connected to the feedback signal, an input of a second one of the plurality of switching transistors being connected to the latch output signal, an input of a third one of the plurality of switching transistors being connected to a second time-varying clock signal, the second switching means being enabled to switch the second voltage value onto the storage output signal when each one of the plurality of switching transistors are enabled by the corresponding transistor input.

13. The sense amplifier of claim 2, wherein the first switching means and the second switching means are never both enabled at the same time.

14. The sense amplifier of claim 2, wherein the first switching means and the second switching means are both disabled at the same time during at least a portion of the first predetermined time period when the driver means provides the storage output signal with the predetermined voltage value.

15. The sense amplifier of claim 2, wherein the first predetermined time period precedes the second predetermined time period.

16. The sense amplifier of claim 2, wherein the first predetermined time period and the second predetemined time period are alternating time periods.

17. The sense amplifier of claim 2, wherein the driver means comprises means for providing the storage output signal with the predetermined voltage value during the first predetermined time period, wherein the predetermined voltage value equals aproximately one-half of the difference between the first voltage value and the second voltage value.

18. The sense amplifier of claim 7, wherein each of the first and second inverter means comprises a pair of transistors.

19. A sense amplifier for amplifying an output signal from a memory storage device, the output signal being a binary logic level signal having one of two different binary logic states stored by the memory storage device, the sense amplifier comprising:

driver means, connected to the output signal, for providing the output signal with a predetermined voltage value during a first predetermined time period, and for allowing a voltage value on the output signal to assume a voltage value provided by the storage device during a second predetermined time period, the assumed voltage value being indicative of the one of the two binary logic states provided by the memory storage device on the output signal, the second predetermined time period being a time period that the assumed voltage value on the output signal is being read from the storage device during a read cycle, the second predetermined time period immediately preceding the first predetermined time period, the first and second predetermined time periods comprising alternating time periods, wherein the driver means comprises a first switching means and a second switching means, the first switching means comprising means, when enabled, for switching a voltage of a first value onto the output signal during the first predetermined time period, the second switching means comprising means, when enabled, for switching a voltage of a second value onto the output signal during the first predetermined time period;

buffer means, having an input connected to the output signal, for comparing the voltage value of the output signal to a threshold value and for providing a feedback signal to the driver means indicative of the result of the comparison; and latch means, connected to the output signal, for storing a voltage value on the output signal at the start of the first predetermined time period during the first predetermined time period, and for providing a latch output signal indicative of the stored voltage value in the latch means during the first predetermined time period;

wherein the driver means comprises means, responsive to both the feedback signal and the latch output signal, for providing the output signal with the predetermined voltage value during the first predetermined time period, wherein when the first switching means is enabled to switch the first voltage value onto the output signal during the first predetermined time period then the voltage value on the output signal is changing toward the predetermined voltage value, the buffer means comprises means for providing the feedback signal to the first switching means to disable the first switching means from further switching the first voltage value onto the output signal when the voltage value on the output signal has reached the predetermined voltage value, and wherein when the second switching means is enabled to switch the second voltage value onto the output signal during the first predetermined time period then the voltage value on the output signal is changing toward the predetermined voltage value, the buffer means comprises means for providing the feedback signal to the first switching means to disable the second switching means from further switching the second voltage value onto the output signal when the voltage value on the output signal has reached the predetermined voltage value.

20. The sense amplifier of claim 19, wherein the first switching means comprises a plurality of switching transistors, each one of the plurality of switching transistors having an output and an input, the output of each one of the plurality of switching transistors being enabled by a certain voltage value at the input of the transistor, the outputs of the plurality of switching transistors being connected in series between the output signal and a first voltage supply having the first voltage value, an input of a first one of the plurality of switching transistors being connected to the feedback signal, an input of a second one of the plurality of switching transistors being connected to the latch output signal, an input of a third one of the plurality of switching transistors being connected to a first time-varying clock signal, the first switching means being enabled to switch the first voltage value onto the output signal when each one of the plurality of switching transistors are enabled by the corresponding transistor input; and wherein the second switching means comprises a plurality of switching transistors, each one of the plurality of switching transistors having an output and an input, the output of each one of the plurality of switching transistors being enabled by a certain voltage value at the input of the transistor, the outputs of the plurality of switching transistors being connected in series between the output signal and a second voltage supply having the second voltage value, an input of a first one of the plurality of switching transistors being connected to the feedback signal, an input of a second one of the plurality of switching transistors being connected to the latch output signal, an input of a third one of the plurality of switching transistors being connected to a second time-varying clock signal, the second switching means being enabled to switch the second voltage value onto the output signal when each one of the plurality of switching transistors are enabled by the corresponding transistor input.

* * * * *